US012810045B2

(12) United States Patent
Dongjie et al.

(10) Patent No.: US 12,810,045 B2
(45) Date of Patent: Nov. 24, 2026

(54) SYSTEM AND METHOD FOR AUTOMATED URBAN PLANNING

(71) Applicant: University of Central Florida Research Foundation, Inc., Orlando, FL (US)

(72) Inventors: Wang Dongjie, Orlando, FL (US); Fu Yanjie, Oviedo, FL (US); Wang Pengyang, Orlando, FL (US)

(73) Assignee: University of Central Florida Research Foundation, Orlando, FL (US)

(*) Notice: Subject to any disclaimer, the term of this patent is extended or adjusted under 35 U.S.C. 154(b) by 973 days.

(21) Appl. No.: 17/734,827

(22) Filed: May 2, 2022

(65) Prior Publication Data

US 2023/0394197 A1 Dec. 7, 2023

Related U.S. Application Data

(60) Provisional application No. 63/218,257, filed on Jul. 2, 2021.

(51) Int. Cl.
*G06F 30/27* (2020.01)
*G06F 30/18* (2020.01)
(Continued)

(52) U.S. Cl.
CPC .............. *G06F 30/27* (2020.01); *G06F 30/18* (2020.01); *G06N 3/04* (2013.01); *G06V 10/764* (2022.01)

(58) Field of Classification Search
CPC ........... G06F 30/27; G06F 30/18; G06N 3/04; G06V 10/764
(Continued)

(56) References Cited

U.S. PATENT DOCUMENTS

| | | | | |
|---|---|---|---|---|
| 2018/0075545 A1* | 3/2018 | Richt | .................. | A01B 79/005 |
| 2020/0082041 A1* | 3/2020 | Albert | .................. | G06N 3/0464 |
| 2021/0271934 A1* | 9/2021 | White | ................. | G06F 18/2113 |

OTHER PUBLICATIONS

Zhang, Yingxue, et al. "Curb-gan: Conditional urban traffic estimation through spatio-temporal generative adversarial networks." Proceedings of the 26th ACM SIGKDD international conference on knowledge discovery & data mining. 2020. (Year: 2020).*

(Continued)

*Primary Examiner* — John E Johansen

(74) *Attorney, Agent, or Firm* — Tiajoloff & Kelly LLP

(57) ABSTRACT

A computerized system and method uses a computer with trainable AI generator and discriminator modules that function together as a generative adversarial network. The discriminator module is trained to receive land-use data and to derive from it quality assessment data corresponding to an assessment of quality of the land-use plan of the land use data. The generator module receives input context data for an associated geographical area, and it generates a tensor defining a land-use plan for the associated geographical area. The generator module is trained in an adversarial training process with the trained discriminator module to generate tensor data for good land-use plans by repeatedly generating land-use plans and receiving assessment data from the discriminator module until it is trained to generate only good-quality land-use plans. The resulting generator module is then used to generate land-use plans for virgin territory.

11 Claims, 12 Drawing Sheets

(51) Int. Cl.
*G06N 3/04* (2023.01)
*G06V 10/764* (2022.01)

(58) Field of Classification Search
USPC .............................................................. 703/1
See application file for complete search history.

(56) References Cited

OTHER PUBLICATIONS

Adams, Urban planning and the development process, Psychology Press 1994, pp. 1 to 11, 231-242 (1994).
Akcay et al., "GANomaly: Semi-supervised anomaly detection via adversarial training", Asian Conference on Computer Vision, pp. 622-637 (2018).
Barton et al., "Healthy urban planning", Built Environment, vol. 31, No. 4 , pp. 281-287 (2005).
Choi et al., "StarGAN: Unified generative adversarial networks for multi-domain image-to-image translation", Proceedings of the IEEE conference on computer vision and pattern recognition, 8789-8797. Sep. 21, 2018.
Ding et al., "Semi-supervised learning on graphs with generative adversarial nets", Proceedings of the 27th ACM International Conference on Information and Knowledge Management. 913-922, Sep. 1, 2018.
Du et al., "Beyond Geo-First Law: Learning Spatial Representations via Integrated Autocorrelations and Complementarity" 2019 IEEE International Conference on Data Mining (ICDM). 160-169 (2019).
Fu et al., "Representing urban forms: A collective learning model with heterogeneous human mobility data", IEEE Transactions On Knowledge And Data Engineering, vol. 31, No. 3, 535-548, May 15, 2018.
Fu et al., "Efficient region embedding with multi-view spatial networks: A perspective of locality-constrained spatial autocorrelations", Proceedings of the AAAI Conference on Artificial Intelligence, vol. 33. 906-913 (2019).
Ganin et al., "Synthesizing Programs for Images using Reinforced Adversarial Learning", International Conference on Machine Learning, 1666-1675, Apr. 3, 2018.
Hoffman et al., CyCADA: Cycle-Consistent Adversarial Domain Adaptation », International Conference on Machine Learning. 1989-1998, Dec. 29, 2017.
Liu et al., "CatGAN: Category-Aware Generative Adversarial Networks with Hierarchical Evolutionary Learning for Category Text Generation", AAAI. 8425-8432, Nov. 20, 2019.
Niemelä, "Ecology and urban planning", Biodiversity & Conservation, vol. 8 (1999), 119-131.
Otto et al., "Linearly recurrent autoencoder networks for learning dynamics", SIAM Journal on Applied Dynamical Systems 18, 1, 558-593, Jan. 15, 2019.
Qiang et al., "Learning to generate posters of scientific papers by probabilistic graphical models", Journal of Computer Science and Technology 34, 1, 155-169, Feb. 21, 2017.
Ratcliffe et al. "Urban planning and real estate development", 4th ed., vol. 8. pp. 3-40 Taylor & Francis (2004).
Sarmad et al., "RI-GAN-Net: A reinforcement learning agent controlled gan network for real-time point cloud shape completion", Proceedings of the IEEE Conference on Computer Vision and Pattern Recognition. 5898-5907, Apr. 28, 2019.
Tzeng et al., "Adversarial discriminative domain adaptation", Proceedings of the IEEE conference on computer vision and pattern recognition. 7167-7176, Feb. 17, 2017.
Wang et al., "Learning urban community structures: A collective embedding perspective with periodic spatial-temporal mobility graphs", ACM Transactions on Intelligent Systems and Technology (TIST) vol. 9, No. 6, 1-28, Nov. 2018.
Wang et al., "Spatiotemporal Representation Learning for Driving Behavior Analysis: A Joint Perspective of Peer and Temporal Dependencies", IEEE Transactions on Knowledge and Data Engineering, vol. 33, No. 2, 728-741 Aug. 14, 2019.
Wang et al., "Ensemble-spotting: Ranking urban vibrancy via poi embedding with multi-view spatial graphs", Proceedings of the 2018 SIAM International Conference on Data Mining. SIAM, 351-359 (2018).
Zhang et al., "Unifying inter-region autocorrelation and intra-region structures for spatial embedding via collective adversarial learning", Proceedings of the 25th ACM SIGKDD International Conference on Knowledge Discovery & Data Mining, 1700-1708, Aug. 4, 2019.
Zhang et al., "TrafficGAN: Off-Deployment Traffic Estimation with Traffic Generative Adversarial Networks", 2019 IEEE International Conference on Data Mining (ICDM). IEEE, 1474-1479 (2019).
Zhang et al., "Curb-GAN: Conditional Urban Traffic Estimation through Spatio-Temporal Generative Adversarial Networks", Proceedings of the 26th ACM SIGKDD International Conference on Knowledge Discovery & Data Mining. 842-852, Aug. 23, 2020.
Zhu et al., "Image reconstruction by domain-transform manifold learning", Nature, vol. 555, 487-492, Mar. 22, 2018.
D. Wang et al., "Reimagining City Configuration: Automated Urban Planning via Adversarial Learning", arXiv:2008.09912v1 [cs.AI], Aug. 22, 2020.
D. Wang et al., "Reimagining City Configuration: Automated Urban Planning via Adversarial Learning", SIGSPATIAL '20: Proceedings of the 28th International Conference on Advances in Geographic Information Systems, pp. 497-506, https://doi.org/10.1145/3397536.3422268, Nov. 13, 2020.
A. Albert et al., "Modeling Urbanization Patterns with Generative Adversarial Networks" arXiv:1801.01710 v1 [cs.LG] Jan. 8, 2018.
J. Shen et al., "Machine Learning Assisted Urban Filling", Anthropocene, Proceedings of the 25th International Conf. of the Assn. of Computer-Aided Architectural Design Research in Asia (CAADRIA) 2020, vol. 2, pp. 679-688 (2020).
A. Noyman et al., "A Deep Image of the City: Generative Urban-Design Visualization", SimAUD 2020, May 25, 2020.
A. Noyman et al., "Deep Image of the City: a generative approach to urban-design visualization", 2020.

* cited by examiner

The geographical definitions of a central area and its surrounding spatial contexts

SYSTEM AND METHOD FOR AUTOMATED URBAN PLANNING

RELATED APPLICATIONS

This application claims the priority of U.S. provisional application Ser. No. 63/218,257 filed Jul. 2, 2021, which is herein incorporated by reference in its entirety.

This invention was made with Government support under Grant number 1947534 awarded by the National Science Foundation. The Government has certain rights in this invention.

FIELD OF THE INVENTION

This invention relates to the area of computer-aided design of cities or towns, and more particularly to use of computer-based artificial intelligence in preparing plans or regulations for land use in certain geographical areas.

BACKGROUND OF THE INVENTION

Urban planning is an interdisciplinary and complex process that is involved with public policy, social science, engineering, architecture, landscape, and other related fields. Here, urban planning refers to the efforts of designing land-use configurations, which is the reduced yet essential task of urban planning. Effective urban planning can help to mitigate the operational and social vulnerability of an urban system, such as high tax, crimes, traffic congestion and accidents, pollution, depression, and anxiety.

Due to the high complexity of urban systems, such tasks are mostly completed by professional planners. However, planning by humans is a very time-consuming process that takes a long time to complete, and results in high costs of preparing urban planning.

In addition, humans may make mistakes in urban planning, producing low-quality land-use plans that can impact on communities by making them unnecessarily vulnerable to traffic congestion, pollution, crime, or any of a myriad of other ills that can be caused by a poor quality land-use regime.

SUMMARY OF THE INVENTION

It is accordingly an object of the invention to provide for a computerized land-use planning system that provides high-quality land-use plans that are beneficial to the resulting communities, and that avoid the high cost and other problems of human-authored land-use plans.

According to an aspect of the invention, a computerized system for generating a land-use plan comprises a computer having an input receiving data and an output transmitting data to a display viewable by a user. The computer has data storage with data therein that provides the computer with a generator module, which is a trainable AI module that has been trained with a computer-supported discriminator module that functions as a generative adversarial network with the generator module so that the generator module generates land-use plan tensor data for good land use plans by repeated training cycles of an adversarial training process. In each of the training cycles, the generator module receives input data having context data for an associated geographical area. It generates land-use data from the input data wherein the land-use data defines a land-use plan for the associated geographical area. The discriminator module receives the land-use data from the generator module and derives from it quality assessment data corresponding to an assessment of quality of the land-use plan of the land use data, and the assessment data is returned to the generator module. The training cycles are repeated for each input data until the generator module learns to derive land-use data that defines land-use plans for which the discriminator module derives quality assessment data that reaches a predetermined threshold value. Then, responsive to being input context data for a new geographical region, the generator module generates a land-use tensor defining a land use plan for the new geographical region, and the computer outputs land-use plan output data defining the land-use plan for the new geographical region.

According to another aspect of the invention, a method for preparing a computerized assessment of land-use plans comprises providing a computerized system supporting a discriminator module as an AI module that is configured to learn to generate output data based on training, and training the discriminator module by applying to it training data comprising sets of training data each comprising input training data and associated output training data. The input training data comprises a plurality of land-use tensor data sets each defining a respective land-use plan for a respective geographical territory, and each of the associated output training data includes assessment data defining a level of quality of the land-use plan of the input data, such that the discriminator module learns to generate assessment data indicative of quality of a land-use plan defined by a land-use tensor data input supplied to the discriminator module.

According to still another aspect of the invention, a computerized system for assessment of land-use plans comprises a computer having an input receiving data and an output transmitting data. The computer has data storage with data that provides the computer with an AI learning system including a discriminator module. The discriminator module has been trained to generate assessment data indicative of quality of a land-use plan defined by a land-use tensor data input supplied to said discriminator module. This training was accomplished by applying to the discriminator module training data comprising sets of training data each comprising input training data and associated output training data, where the input training data comprised a plurality of land-use tensor data sets each defining a respective land-use plan for a respective geographical territory, and each of the associated output training data included assessment data defining a level of quality of the land-use plan of the input data.

Another aspect of the invention provides a method for generating a land-use plan that comprises providing a computerized system as described above, in which the AI learning system also includes a generator module, and the generator module and the discriminator module interact as a generative adversarial network. The generator module is trained in that generative adversarial network to output a set of land-use data that corresponds to a land-use tensor defining a land-use plan for a geographical area responsive to the generator module receiving vector data that corresponds to a vector of context data for the geographical area. That training includes providing to the generator module a plurality of sets of training vector data each comprising respective context data for a respective geographical territory. For each of the sets of the training vector data, sets of land-use data are repeatedly generated with the generator module that each corresponds to a respective land-use tensor defining a respective land-use plan for the geographical region, each of the sets of land-use data are transmitted to the discriminator module so as to derive respective assessment data, and the respective assessment data are returned so that the generator module learns from them until the discriminator module returns assessment data indicating that a most recent set of the land-use data defines a land-use plan of a quality that reaches a predetermined value.

The method may further comprise inputting planning input data comprising context data for a virgin geographical territory to the generator module after the training, and generating land-use data with the trained generator module that defines a land-use plan for the virgin territory. The land-use data or display data derived from it are output to a user of the computerized system.

According to still another aspect of the invention, a computer system is provided with a generator module and a discriminator module that form a general adversarial network. The generator is configured to receive input context data for a geographical area and to produce a land-use tensor defining a land use plan for it. The discriminator is trained to receive a land use tensor and the associated context data, and from that to generate a quality assessment of how good or bad the land-use plan is for the area. In operation, the generator is provided with an input context data vector for a virgin area, and it generates a land-use tensor for the virgin territory. The tensor is received by the discriminator, which returns an assessment value. The generator receives this assessment value and generates a new land-use tensor to try to improve the assessment value, and a new assessment value is generated by the discriminator for the new tensor and sent to the generator. This general adversarial network cycle continues until it converges, i.e., the generator produces a land-use tensor that the discriminator assesses as adequately good, i.e., it produces assessment data that reaches a threshold quality value. The resulting good land-use plan tensor is then output or displayed in a user-comprehensible report format.

The system here addresses the automated urban planning problem as a task of learning to configure land-uses, given the surrounding spatial contexts. To set up the task, a land-use configuration is defined as a longitude-latitude-channel tensor, where each channel is a category of points of interest ("POIs") and the value of an entry is the number of POIs. An adversarial learning framework then automatically generates such a tensor for an unplanned area.

To accomplish this, the contexts of surrounding areas of an unplanned area are first characterized by learning representations from spatial graphs using geographic and human mobility data.

Second, each unplanned area and its surrounding context representation are combined as a tuple, and all the tuples are categorized into positive samples (well-planned areas) and negative samples (poorly-planned areas).

Third, an adversarial land-use configuration approach is developed, where the surrounding context representation is fed into a generator to generate a land-use configuration, and a discriminator learns to distinguish among positive and negative samples.

Finally, two new measurements are devised to evaluate the quality of land-use configurations, and these present extensive experiment and visualization results to demonstrate the effectiveness of the method.

Developing a data-driven AI-enabled automated urban planner requires addressing three points:

(1) how to quantify a land-use configuration plan;

(2) how to develop a machine learning framework that can learn the good and the bad of existing urban communities in terms of land-use configuration policies; and (3) how to evaluate the quality of generated land-use configurations.

First, to teach a machine to reimagine the land-use configuration of an area, a machine-perceivable structure for a land-use configuration must be defined and created.

In practice, the land-use configuration plan of a given geographical area is visually defined by a set of POIs and their corresponding locations (e.g., latitudes and longitudes) and urban functionality categories (e.g., shopping, banks, education, entertainment, residential). A close look into such visually-perceived land-use configuration reveals that the land-use configuration is indeed a high-dimensional indicator that illustrates what should be put into an unplanned area, and where it should be put.

A land-use configuration includes not just location-location statistical auto-correlation but al so location-functionality statistical autocorrelation. To capture such statistical correlations, a land-use configuration plan is represented by data defining a latitude-longitude-channel tensor, where each channel is a specific category of POIs that are distributed across the unplanned area, and the value of an entry in the tensor is the number of POIs. In this way, the tensor can describe not just the location-location interaction of POIs, but also location-function interaction of POIs.

Second, after the quantitative expression of a land-use configuration is defined, the second issue of how to teach a machine to automatically generate a land-use configuration is addressed.

Based on analysis of large-scale urban residential community data, the following important observations can be made:

1) an urban community can be viewed as an attributed node in a socioeconomic network (i.e., a city), and this node proactively interacts with surrounding nodes (environments);

2) the coupling, interaction, and coordination of a community and surrounding environments significantly influence the livability, vibrancy, and quality of a community.

Based on these observations, the land-use configuration planning problem is converted to address the objective of teaching a machine to generate a land-use configuration tensor based on the surrounding context/area. In other words, the problem is reduced to learning a conditional probability function that maps a surrounding context representation to a well-planned land-use configuration tensor, instead of a poorly-planned land-use configuration tensor.

This reduced objective is addressed by deep adversarial learning. The task is reformulated into an adversarial learning paradigm, in which:

1) A neural generator is analogized and functions as a machine planner that generates data defining a land-use configuration for a geographical area;

2) The generator generates a configuration in terms of data defining a pattern feature representation of surrounding spatial contexts.

3) The surrounding context representation is learned via self-supervised representation learning collectively from spatial graphs.

4) A neural discriminator classifies whether the generated land-use configuration is well-planned (positive) or poorly-planned (negative).

5) A new mini-max loss function is constructed to guide the generator to learn from the goods of well-planned areas and the bads of poorly-planned areas.

Third, the question of evaluation of the quality of a generated land-use configuration is addressed.

The most sound evaluation or validation would be to work with urban developers and city governments to implement an AI-generated configuration into an unplanned area, and then observe the development of the area in the following years. However, that is not realistic.

Therefore, two strategies may be employed to assess the generated configurations:

1) One discriminator process outputs the quality score of a configuration by learning from training data provided from historical land-use configurations. Specifically, a machine-learning model is used to learn the data distribution of assessments of quality of original land-use reconfiguration samples. After the generated solutions are obtained, the trained discriminator has the ability to give a score.
2) Experienced regional planning experts may be invited to evaluate the quality of the generated solutions, and human experts may be relied upon to perform analysis on multiple case studies.

An adversarial learning framework is used to generate effective land-use configurations by learning from urban geography, human mobility, and socioeconomic data. In this adversarial learning framework, specifically:

1) a latitude-longitude-channel tensor quantifies a land-use configuration plan;
2) a socioeconomic interaction perspective is provided to understand urban planning as a process of optimizing the coupling between a community and surrounding environments;
3) the automated urban planning problem is reformulated into an adversarial learning framework that maps surrounding spatial contexts into a configuration tensor by a machine generator; and
4) although evaluation is challenging, multiple aspects to conduct extensive experiment and visualization with real-world data show the value of the present method.

The methods of the invention include the method of training the system and of generating and displaying a land-use plan using the above system.

In order to generate a suitable and excellent land-use configuration solution objectively and reduce the heavy burden of urban planning specialists, an automatic land-use configuration planner framework is provided. This framework generates a land-use solution based on the context embedding of a virgin area.

Specifically, first, the residential community and its context based on the latitude and longitude of residential areas is determined. Explicit features of the context are then extracted from three aspects: (1) value-added space; (2) POI distribution; and (3) traffic condition. Afterward, the explicit feature vectors are mapped to the geographical spatial graph as the attributes of the corresponding node. Next, the graph embedding technique is utilized to fuse all explicit features and spatial relations in the context together to obtain the context embedding. Then excellent and terrible land-use configuration plans are distinguished based on expert knowledge. Finally, the context embedding, excellent and terrible plans were input into the LUCGAN system to train the system to recognize the distribution of excellent plans.

The LUCGAN system as a result generates excellent land-use plans based on the context embedding when its AI system converges on a result, and extensive experiments were conducted to exhibit the effectiveness of the automatic planner, as will be described herein.

DETAILED DESCRIPTION

The system is a computerized system using software that provides for its training using adversarial deep learning in a Generative Adversarial Networks (GAN) environment with a neural generator module and a neural discriminator module. Adversarial deep learning computer systems rely on computer hardware, usually having one or more processors and connected computer-accessible memory or data storage, as are well known in the art.

In the preferred embodiment, the system is implemented in the Ubuntu 18.04.3 LTS operating system, in a computer system with an Intel® Core™ i9-9920X CPU processor operating at 3.50 GHz, connected with a one-way SLI Titan RTX, as well as 128 GB of RAM, and a 2 TB hard drive. The system operates using a software framework of Python 3.7.4 and TensorFlow 2.0.0.

Figure 16:
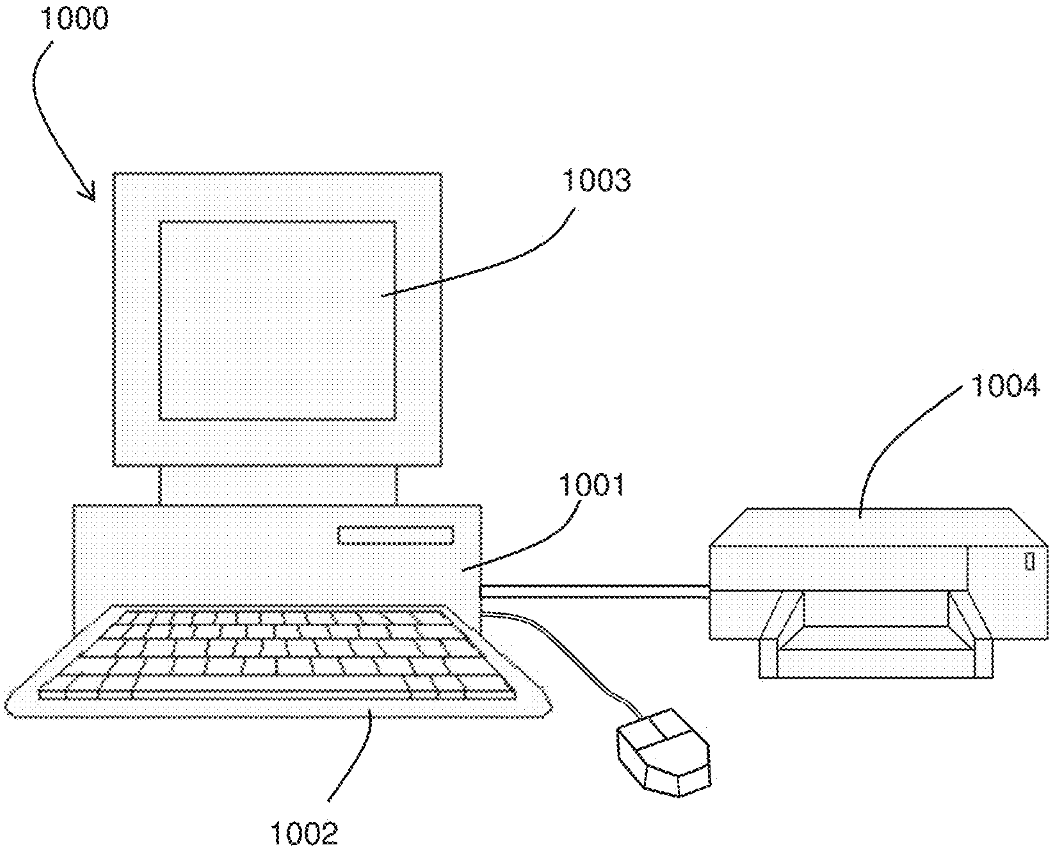
FIG. 16 is a diagram showing a computer system of a sort that may be used to support the invention.

The computer system has software stored and executed therein that supports a generator module and a discriminator module that are trained neural AI modules. Externally, the system may be a simple computer system 1000 as illustrated in FIG. 16, with a central processing unit 1001 as described above, a keyboard 1002 or other entry device such as a mouse, and output devices such as monitor display 1003 and printer 1004, all well-known in the art, and it is preferably equipped with network connections to the Internet or a local network of other computers for receiving and transmitting data. Alternatively, different modules of the system may be supported on separate computers that may be connected in a network or other data-transfer devices.

Figure 1:
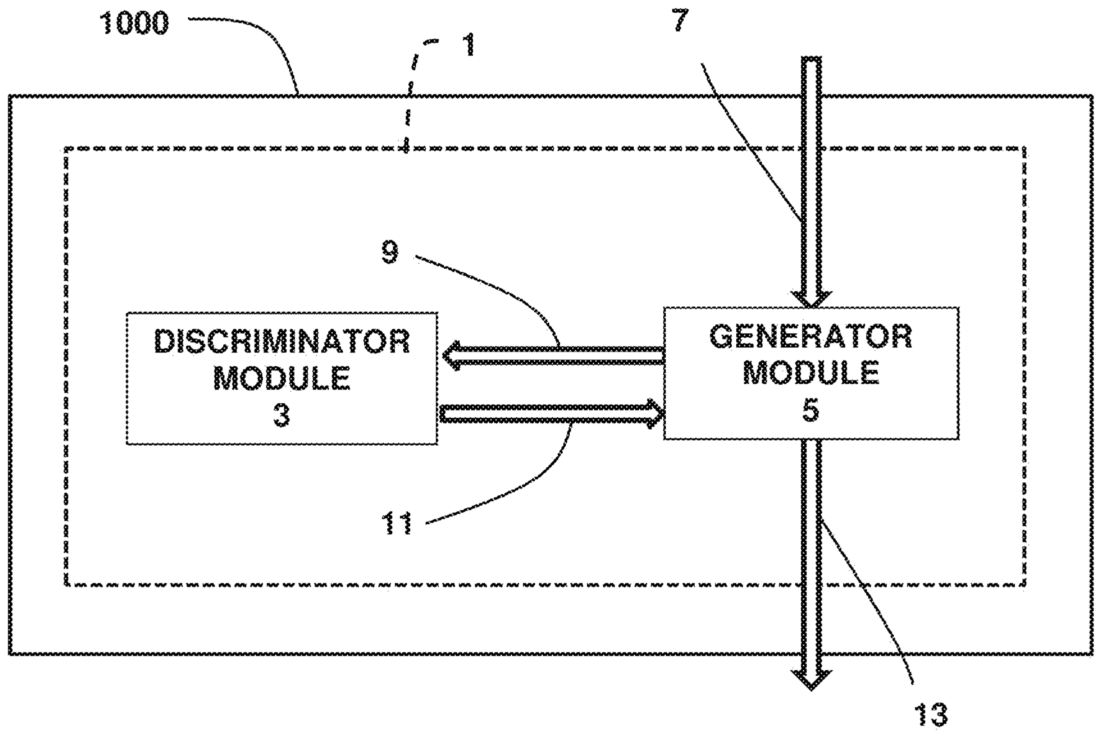
FIG. 1 is a diagram of a computerized system according to the invention.

Referring to FIG. 1, the adversarial learning network 1 supported by the computer system 1000 has at least two connected modules, a discriminator module 3 and a generator module 5.

The generator module 5 generates data that defines land-use tensors from an input data structure or vector of data that defines a territory for which a land-use plan is desired.

The discriminator module 3 produces an assessment value, such as Q value from 0 to 1, for an input land-use tensor that is indicative of the quality of the land-use plan defined by the tensor. In operation, the system generates a good-quality land-use plan for a new area when it is provided with a data input that corresponds to the area for which a land-use plan is desired.

The input data 7 is a vector defining a graph database of an unplanned area and its surrounding contexts, meaning the attributes of the unplanned area and the surrounding areas that may impact on the land-use to be implemented. From this vector, the generator generates a land-use plan in the form of a tensor data structure, and transmits that land-use tensor data 9 to the discrimination module 3. The discriminator module 3 then assesses the land-use tensor data 9 received from the generator module 5 and returns an assessment output 11 that indicates how good or bad the land-use plan defined by the tensor 7 as an assessment data value or a Q value indicative of its quality.

The system then determines whether the assessment data output 11 has an assessment data value produced by the discriminator module 3 that is high enough, e.g., whether the Q value has reached a predetermined threshold value. Responsive to a determination that the assessment value is high enough, meaning that the land-use plan is good, the generator outputs the land-use tensor at 13 to a user via a display device, as is well known in the art, e.g., a monitor or printer connected with the computer system. If the assessment data value is below a threshold value, the generator module generates another land-use tensor, and sends it to the discriminator module, which determines if the new tensor represents a good or bad land-use plan.

The process of generating a land-use tensor from the input context vector and assessing the quality of the generated land-use tensor is repeated until a land-use tensor is generated that the discriminator determines to be of good enough quality, in other words, that obtains a high enough assessment value from the discriminator module.

The Land-Use Plan Tensor and its Data Structure

The land-use plan data that is output by the generator module of the system and that is assessed by the discriminator module constitutes stored data defining an array or tensor that is organized in a data structure that allows for its conversion to output data for output or display on a device such as a monitor, or to be printed, in a human-comprehensible form such that the human user can understand the land-use plan of the tensor.

Figure 2:
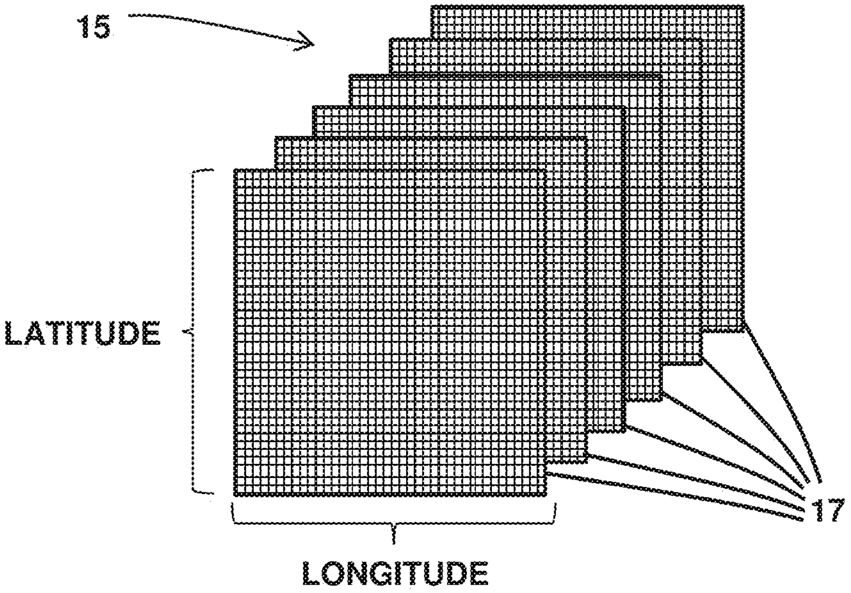
FIG. 2 is a diagram illustrating the data structure of a land-use tensor generated by the system and method herein.

FIG. 2 illustrates the structure of a land use tensor 15. The land-use tensor 17 generally has at least three dimensions, two of which correspond to geographical latitude and longitude of the virgin territory for which the land-use plan is desired, and a third dimension of the array or tensor storing data that, together with defines a plurality of layers 17 of parameters, i.e., POI categories, over the territorial area of the land-use plan. This means that in each layer 17 of the land-use tensor 15, there is a data value for each geographical element of the array corresponding to a location identified by latitude and longitude.

For example, a given layer 17 may contain elements for each geographical location element corresponding to stores, identifying how many stores are in that location in the land-use plan. Another layer 17 may be composed of the geographical array of data indicating, for each element location, the number of dwellings, or the number of public transportation stations, etc. The result is a multilayered virtual map of the territory, with a plurality of layers 17 each directed to and defining a respective type of land use over the geographical area.

Expressed slightly differently, the land-use plan output is a 3D tensor and the three dimensions of the tensor are longitude, latitude, and POI category. The tensor reflects the POI distribution of the target area and sets out where buildings or other structures should be located, and what kind of buildings or other structures they should be.

Training the Discriminator Module

As discussed above, the discriminator and generator modules 3 and 5 are AI system components that must be trained to provide the required functions.

The discriminator module is trained to receive a land-use tensor input and derive an assessment value for that land-use tensor input, which may be a Q value ranging from, e.g., 0 to 1, or 1 to 10, or 1 to 100, corresponding to a very bad or terrible plan (0) to a very good or excellent plan (1, 10 or 100), or an intermediate quality level indicative of some level of good of the plan. The discriminator module is trained by providing it with data inputs in the form of tensor data structures defining land use, each of which is coupled with an associated output or Q value reflecting whether that particular tensor defines a good or bad land-use plan.

By repeatedly supplying the discriminator with a series of training land-use tensor data defining land-use plans for land areas that are good, well-planned, or excellent land-use planning, or poor or bad land-use planning and, for each training land-use plan tensor, a respective established training assessment data value or Q value associated with that plan, the system, i.e., the discriminator module, learns how to determine whether a given land-use plan tensor defines a good or bad land-use plan, and outputs an appropriate assessment data value using that discrimination capability.

The classification of plans as good or bad is accomplished by analyzing the tensors using a hyperparameter Q that is defined in the system framework. Although the general meaning of Q is a range of assessment of the quality of the given land-use plan defined by the input tensor, the meaning of Q depends on urban planners' requirements, and may vary based on particularly desirable parameters of the land-use plans. For instance, if urban planners want to produce a land-use configuration that has a high greenery rate, the meaning of Q is the greenery rate of land-use configurations. The greenery rate of all the training land-use configurations is calculated. Then, a threshold for Q, such as 0.5, is set in the system by a user or automatically, and land-use configurations in which the greenery rate is larger than 0.5 are classified as good. Otherwise, those land-use plan configurations are classified as bad.

On the other hand, different land-use plan quality assessments may be made based on quality of life parameters or efficiency of commuting parameters, or other features of a land-use plan that may be deemed desirable by the user of the system. For whichever type of assessment parameter is desirable, the discriminator module is trained using quality assessment data for the training land-use tensors that reflect that assessment parameter or those parameters.

In any case, the output of the discriminator is either a positive or negative assessment of the input land-use plan tensor.

Training the Generator Module

Once the discriminator module 3 is trained, the generator module 5 is then trained to generate land-use tensors containing data that represents good land-use plans for a given set or vector of input data defining a virgin territory for which land-use planning is sought.

For training, the GAN system generator module generates land-use plan tensors and outputs them to be classified as good or bad land-use plans by the neural discriminator module.

The training inputs for the generator module are each a vector, array, or tensor of stored data relevant to a virgin territory for which a land-use tensor is to be generated. The input vector is derived from a spatial attributed graph database of nodes that define the areas surrounding the virgin territory, referred to here as contexts, all of which are nodes of the graph database.

The graph database includes respective arrays of data for each of the nodes, each of which is a set of explicit feature data values that define one or more of the characteristics of each of the associated surrounding contexts. The sets of context data may define, for example, characteristics such as traffic conditions, demographical data, and economic development, or other attributes of the contexts, such as for example the presence of specific categories of POIs in each of the contexts, or transportation parameters.

The vector to be input into the generator is derived from the graph database by converting the characteristics of the surrounding contexts into a low-dimensional vector (latent embedding) using a graph data encoder supported in the system. The vector preferably contains data defining all socioeconomic characteristics of the surrounding contexts that affect the land-use configuration generation of the target area, as will be set out below.

The latent embedding input vector contains all characteristics of the surrounding contexts and provides them into the generator, which enables the generator to produce a land-use configuration for the corresponding virgin territory. The submission of this input vector data to the generator requires that the land-use planning situation of the surrounding contexts is clear, and if that is the case, the generator can generate configurations based on the vector containing the encoded data of the graph database for the surrounding contexts.

The process of training the generator module starts by providing an input to the generator in the form of a vector encoded from a geographical graph database, as described above, of contexts for a virgin territory. From that vector of data, the generator then produces a land-use plan tensor for the virgin territory surrounded by the contexts as so defined.

Initially, when the generator has not been trained, the land-use tensor that is generated is probably not a very good land-use plan, and may even be simply a product of random assignment of data values to create the land-use tensor. However, during training of the generator, the land-use tensor is output to the discriminator, which returns a positive or negative assessment of the land-use tensor to the generator. Responsive to receiving data indicating that the assessment is negative, the generator generates another land-use tensor for the same input vector of contexts for the virgin territory. That new tensor is sent to the discriminator, which returns a new assessment data value, e.g., positive or negative, for the new land-use tensor. If that assessment value is negative the generator generates another land-use tensor, which is sent to the discriminator and assessed. That cycle is repeated until a positive result is returned for the most recent land-use tensor. The training then continues, with the generator then being given a new input vector for a new virgin territory, and the cycle of generation and assessment by the discriminator is repeated until the generator generates a positive assessment of the land-use tensor for that new vector. The process then continues with still another new vector for contexts of still another virgin territory.

Over time, the above process trains the generator to create land-use tensors from input vectors of contexts of virgin territories where the land-use tensors are assessed as good by the discriminator.

Once it is trained adequately, the system is then provided with input data that defines a virgin territory, with its contexts, for which land-use planning is sought. Based on that input data, the system generates an output in the form of a tensor that contains data defining a good land-use plan for that territory.

Framework Overview

As the term is used herein, a central area is a generally square geographical area that is centered on a geographical location (i.e., latitude and longitude), where there is an unplanned area. In the example, the central area is 1 $km^2$. The contexts of a central area wrap the residential community from different directions.

Figure 3:
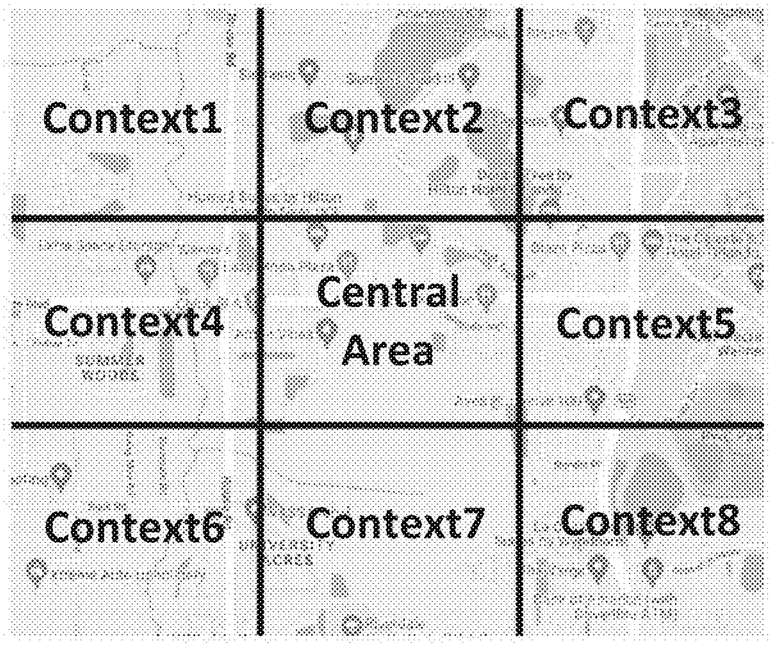
FIG. 3 is a diagram of the geographical definitions of a central area and it surrounding spatial contexts.

FIG. 3 represents the spatial relationship between a central area and its contexts. There are many POIs in the central area and its contexts, all of which affect development of an unplanned area.

The contexts of a virgin area R are $[C_1 \sim C_8]$, and the land-use configuration plan is a tensor or array M. The tensor M is organized as a data structure that is a multi-channel image, in which each channel represents a respective one of POI category data distributions. An explicit feature vector F describes the situation of the context environments, and the vector $F \in R^{8 \times K}$, where the number of contexts is 8 and K is the dimension of the explicit feature vector of each context.

Figure 4:
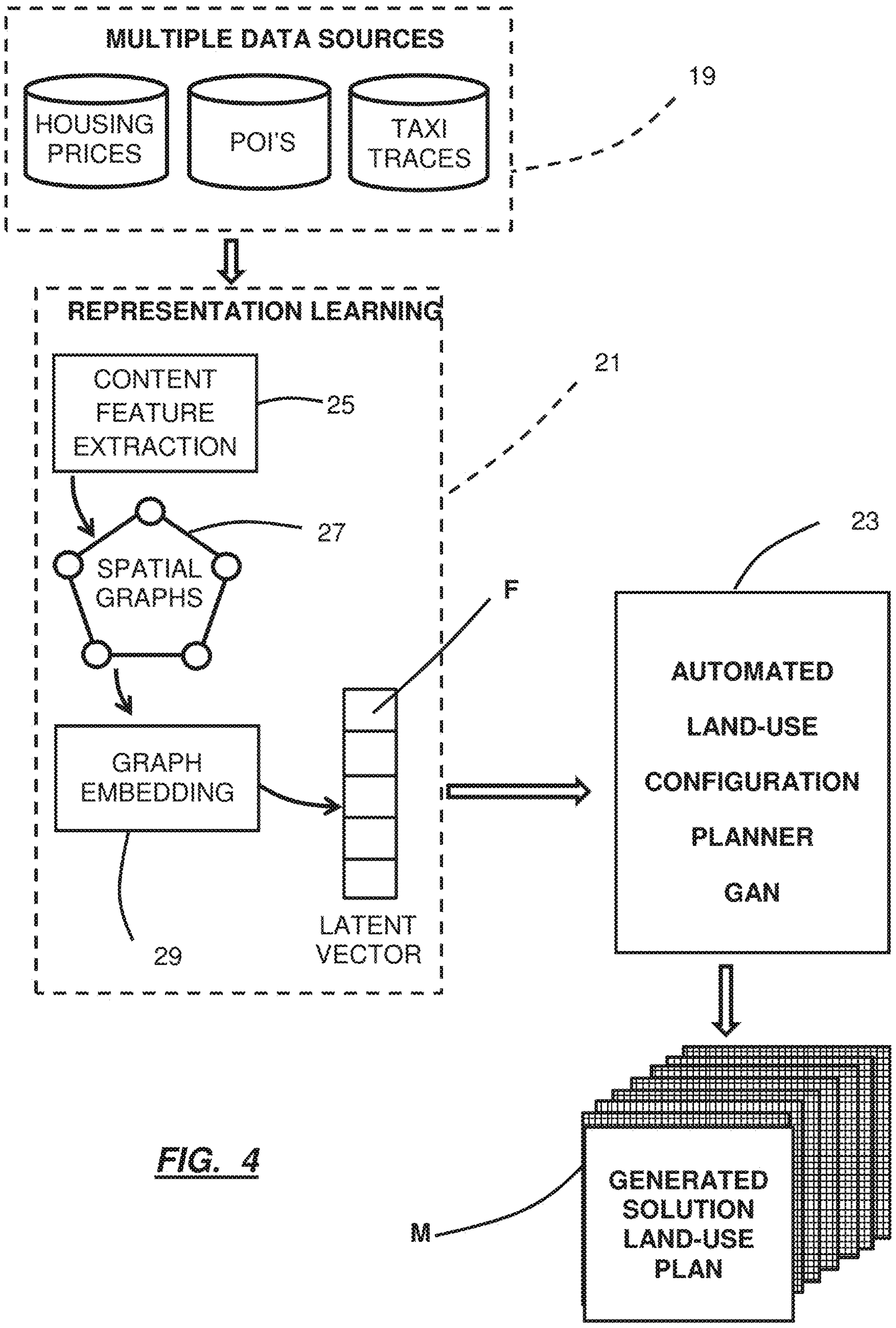
FIG. 4 is a diagram of the overall framework of the invention.

FIG. 4 is a diagram showing an overview of the system framework. The framework includes steps of:

first, multiple data sources 19, such as urban-community related data (for example, housing prices), points-of-interest data, and human mobility data (for example, taxicab GPS traces) are collected;

second, spatial-graph representation learning learns the representation of the surrounding contexts; and third, an adversarial land-use configuration machine is developed and used to automate planning and to generate recommended land-use configurations.

The purpose of the framework is to take the explicit feature vector F as input, and from vector F to derive and output a corresponding excellent land-use configuration solution M.

Referring to the diagram of FIG. 4, the method employs a land-use configuration generative adversarial network ("GAN" or "LUCGAN") that in operation has two main parts:

(i) learning representation 21 of the contexts of the virgin area; and (ii) generating 23 of a land-use configuration solution for the virgin area.

In the first part, explicit features of the contexts are first extracted from value-added space, POI distribution, public and private transportation conditions at 25. Then, at 27, a graph structure is constructed to capture the geographical spatial relationship between the virgin area and its contexts. Afterward, the explicit features of contexts are mapped to the graph as attributes of corresponding nodes. The attributed spatial graph incorporates all characteristics of contexts together. Next, at 29, a variational graph auto-encoder (VGAE), a computer-supported program, which may be generally referred to as graph embedding, is utilized to obtain the latent representation of the contexts. Thus, the final representation of the contexts of virgin areas through the first part is obtained as latent vector F.

In the second part, the latent representation of the contexts, excellent land-use configuration samples, and terrible land-use configuration samples are input into an extended generative adversarial network. The extended GAN generates the land-use configuration solution based on the contexts embedding.

Moreover, a new GAN loss is customized that makes the model learn the distribution of excellent plans and keep away from the terrible plans. When the model converges, the generator of the extended GAN produces suitable and excellent land-use configuration solutions in an objective angle based on the latent context embedding.

Explicit Feature Extraction for Context Environments

The land-use configuration solution of an unplanned area has a strong relationship with its contexts. For example, if there are many commercial zones in the contexts of the unplanned area, redundancy of the same category POI should be avoided in the planning. This is because the unplanned area can be made to possess different functions compared with its contexts, which is beneficial for the development and communication among the virgin area and its contexts. The intrinsic characteristics of the contexts are derived completely by extracting multiple explicit features.

There are many indicators that describe contexts data for environments. Here, four exemplary views are described that capture the features of the contexts:

(1) Value-added Space. Commonly, the variation of house prices reflects the value-added space of one area. Thus, the changing trend of house price of the contexts [$C_1$~$C_8$] is calculated in a period of the preceding continued six months. Here, the context $C_1$ is taken as an example to explain the calculation process. First, the housing price list among t months is obtained. Then, the changing trend of house price is calculated by taking the current house price value and subtracting the previous house price value. The changing trend of $C_1$ is derived as $$v_1 = \lfloor v_1^1, v_1^2, \ldots, v_1^{t-1} \rfloor$$

where $$v_1^i$$

represents the value of the changing trend at i-th month. Finally, the house price changing trend of all contexts is collected together, and the collected result is denoted as $V=[V_1, V_2, \ldots, V_8]$, where the matrix $V \in \mathbb{R}^{8\times t-1}$.

(2) POI Ratio. Since various POIs provide diverse services to residents, the ratio of different types of POIs is a good indicator for indicating the functions of the area. Therefore, the POI ratio of the contexts [$C_1$~$C_8$] is calculated. Here, $C_1$ is taken as an example to explain the calculation process. First, the count of each POI category is summed up to form a feature vector. Each item in the feature vector is then divided by the sum of all POI categories. The POI ratio of $C_1$, is obtained, and is denoted by $$r_1[r_1^1, r_1^2, \ldots, r_1^m]$$

where $$r_1^i$$

represents the ratio of i-th POI category in $C_1$ and m is the total number of POI categories. Finally, the POI ratios of all contexts are collected together. The collected result is denoted as $R=[r_1, r_2, \ldots, r_8]$, where the matrix $R \in \mathbb{R}^{8\times m}$, and m is the number of POI categories.

(3) Public Transportation. Public transportation is one popular travel mode due to its convenience and cheapness, so public transportation is a vital factor to be considered to describe the human mobility patterns. Thus, features are extracted that related to public transportation to describe the public traffic situation of the contexts $C_1$~$C_8$. $C_1$ is taken as an example to show the calculation details. The feature vector of public transportation is calculated from five perspectives:

(1) the leaving volume of $C_1$ in one day, denoted by $$o_1^1;$$

(2) the arriving volume of $C_1$ in one day, denoted by $$o_1^2;$$

(3) the transition volume of $C_1$ in one day, denoted by $$o_1^3;$$

(4) the density of bus stop of $C_1$, denoted by $$o_1^4,$$

which reflects the number of bus stops per square meter;

(5) the average balance of smart card of $C_1$, denoted by $$o_1^5,$$

which shows the economic expenditure of people in the travel field.

The public transportation feature vector of $C_1$ can be denoted as $$[o_1^1, o_1^2, \ldots, o_1^5].$$

Finally, the public transportation feature vectors of all contexts are collected together, and the collected result is denoted as $O=[o_1, o_2, \ldots, o_8]$, where the matrix $O \in \mathbb{R}^{8\times 5}$.

(4) Private Transportation. Taxi is another important tool for people traveling. The taxi trajectory data reflects the people's flow count and the traffic congestion situation of an area. The features of the private transportation condition of the contexts $[C_1 \sim C_8]$ are determined. Here, $C_1$ is taken as an example to illustrate the calculation process. The features of private transportation are counted or enumerated from the following five perspectives:

(1) the leaving volume of $C_1$ in one day, denoted by $$u_1^1;$$

(2) the arriving volume of $C_1$ in one day, denoted by $$u_1^2;$$

(3) the transition volume of $C_1$ in one day, denoted by $$u_1^3;$$

(4) in $C_1$, the average driving velocity of a taxi in one hour, denoted by $$u_1^4;$$

(5) in $C_1$, the average commute distance for a taxi, denoted by $$u_1^5;$$

Then, the feature vector of private transportation can be denoted as $$[u_1^1, u_1^2, \ldots, u_1^5].$$

Ultimately, the private transportation feature vectors of all contexts are collected together, and the collected result is denoted as $U=[u_1, u_2, \ldots, u_8]$, where the matrix $U \in \mathbb{R}^{8\times 5}$.

After that, the explicit feature set of the contexts $C_1 \sim C_8$ is obtained. That set contains four kinds of features [V, R, O, U], which describe the context environments from four perspectives.

Explicit Features as Node Attributes: Constructing the Spatial Attributed Graph

The context environments wrap the residential community area from different directions, resulting in spatial correlation among areas. That phenomenon indicates that spatial graphs may be exploited to capture those spatial correlations.

Figure 5:
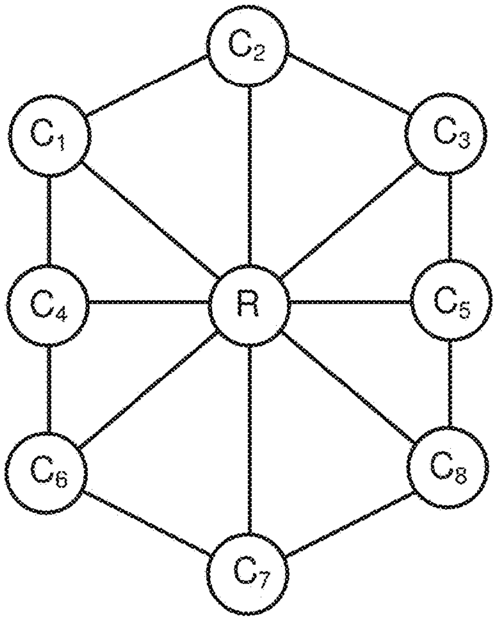
FIG. 5 is a diagram of the graph structure between a central area and its surrounding contexts.

Specifically, FIG. 5 shows an example of such a graph structure between a central area or residential community R and its surrounding spatial contexts, where the nodes $C_1$ to $C_8$ represent the contexts, the node R is the residential community, and the edge between any two nodes reflects the connectivity between them.

In order to fuse the spatial relationship and explicit features of the contexts, a spatial attributed graph structure is constructed. Formally speaking, the explicit features are mapped to the spatial graph based on the corresponding context node as the node attribute.

Figure 6:
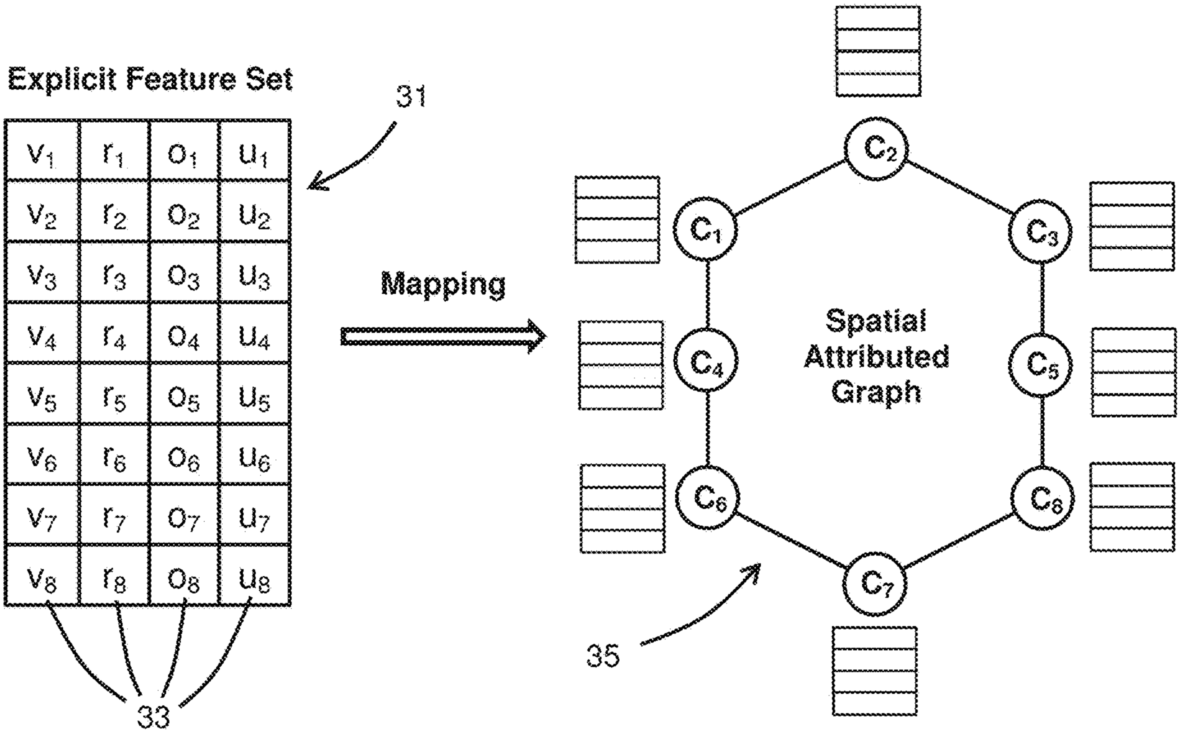
FIG. 6 is a diagram illustrating construction of the spatial attributed graphs.

FIG. 6 is an illustration of construction of spatial attributed graphs, and expresses the construction process of the spatial attributed graph. The explicit feature array 31 contains a set of feature vectors 33, and each feature vector is mapped to the corresponding nodes by a column-wise strategy. The resulting graph 35 contains not only the explicit feature vector of the context data, but it also includes the spatial relations among them.

Learning Representation of the Spatial Attributed Graph

Generally, the generator and discriminator modules of the AI-based planner are not able to directly comprehend the surrounding environment or the spatial graph database of the context data for the purpose of generating land-use configurations. To generate appropriate land-use configurations, representative features from the surrounding environment are extracted to a vector format of data that the AI planner modules can understand.

Learning embedding is a highly effective method to achieve this goal. The system of the present disclosure therefore may rely on spatio-temporal representation learning that preserves the characteristics of items of data that are of interest into a low dimensional vector for creation of the input vector of context data for the generator module 5 or the discriminator module 3. The objective of the representation learning is to obtain a low-dimensional representation of original data in latent space.

In general, there are three types of representation learning models: (1) probabilistic graphical models; (2) manifold learning models; (3) auto-encoder models. The probabilistic graphical models build a complex Bayesian network system to learn the representation of uncertain knowledge buried in original data. However, it is hard to find the topology structure of the Bayesian network and calculate the transfer probability among nodes in the graphical model. The manifold learning models infer low-dimensional manifold of original data based on neighborhood information by non-parametric approaches. The models have a solid theoretical basis, but the resolution process requires a great deal of time. The auto-encoder models learn the latent representation by minimizing the reconstruction loss between original and reconstructed data.

The computer system supports an AI learning component that can provide the necessary training to produce latent embedding vectors that faithfully preserve the context data of the context data graph database for a geographical region for which a land-use tensor has been or is to be developed. The AI learning component of the system includes an encoding module and a decoding module. The encoding module receives as input a spatial graph database such as that of the context data for a geographical region, and it produces a vector output that embeds that data. The decoder module receives a vector such as the one output by the encoder module, and generates from it a graph database.

In the training of the encoding part of the system, the encoding module is provided with one or more graph database training inputs, and produces from the graph database a corresponding encoded data vector. That encoded vector is then transferred to the decoder module and decoded to produce a decoded graph data base that is compared to the original graph database to assess the difference caused by the encode/decode process. The encode-decode process is repeated until the training process converges, i.e., the decoded graph database differs from the original graph database by a determined amount below a predetermined training threshold value. The encoding module is at that point trained so that it is used to convert or encode a spatial graph database of context data to a data vector that can be provided to and understood by the generator module or the discriminator module.

Figure 7:
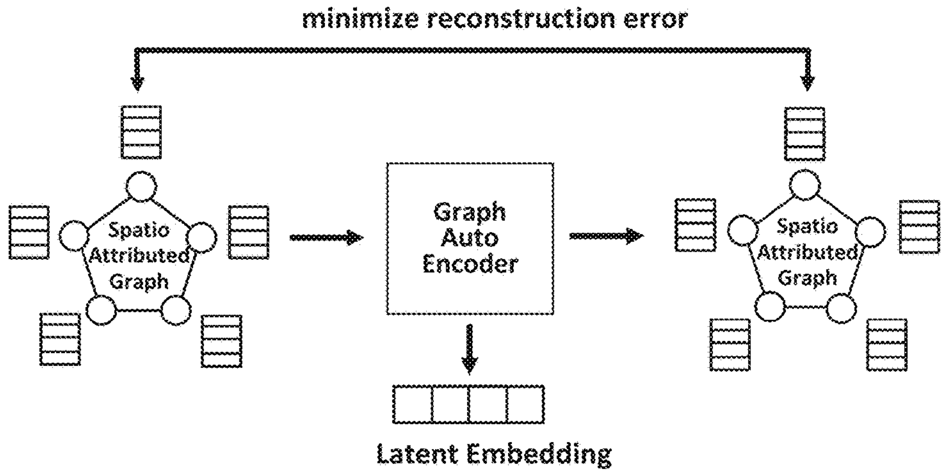
FIG. 7 is a diagram of a representation learning module that obtains surrounding context representations by minimizing the reconstruction loss of spatial attributed graphs.

FIG. 7 schematically illustrates this development of a spatial representation learning framework to preserve and fuse the explicit features and spatial relationship in the contexts. The graph auto encoder repeats its cycle of coding a latent embedding and decoding the latent embedding until the reconstruction from decoding is minimized, at which point graph encoder is adequately trained, and the latent embedding of the graph database is usable by the generator and discriminator modules.

Formally, the spatial attributed graph G is expressed as G=(X, A), where A is the adjacency matrix that expresses the accessibility among different nodes; X is the feature matrix of the graph, here, X=[V, R, O, U], and the concatenation direction is row-wise. In order to get the latent graph embedding z, the reconstruction loss between original graph G and the reconstructed graph $\hat{G}$ is minimized by an encoding-decoding framework.

The encoder part has two Graph Convolutional Network (GCN) layers supported by software executed by the computer used in the system.

The first GCN layer, $GCN_1$, receives data defining X and A as input and outputs data defining the feature matrix of low-dimensional space $\hat{X}$. The encoding process can be expressed or formulated as:

$$\hat{X} = GCN_1(X, A) = RELU\left(\hat{D}^{-\frac{1}{2}} A \hat{D}^{-\frac{1}{2}} X W_1\right) \tag{1}$$

where $\hat{D}$ is the diagonal degree matrix, $W_1$ is the weight matrix of the $GCN_1$, and the whole layer is activated by the ReLU (Rectified Linear Unit) activation function.

Based on the latent embedding z sampled from a prior Normal Distribution, the second GCN layer, $GCN_2$, is responsible for assessing the parameters of the prior distribution. Formally, the second GCN layer receives data of $\hat{X}$ and A as input and then outputs data corresponding to the mean value μ and the variance value $\delta^2$. The calculation process of the second GCN layer therefore can be formulated as:

$$\mu, \log(\delta^2) = GCN_2(X, A) = \hat{D}^{-\frac{1}{2}} A \hat{D}^{-\frac{1}{2}} \hat{X} W_2 \tag{2}$$

where $W_2$ is the weight matrix of $GCN_2$. Next, the reparameterization trick is used to approximate the sample operation to obtain the latent representation z:

$$z=\mu+\delta\times\epsilon \tag{3}$$

where $$\epsilon\sim\mathcal{N}(0,1).$$

Here, the N function represents the Normal Distribution, which is a default writing style well-known in the art of computer science domain. The decoding function and the encoding function are the two main parts of graph auto encoder software.

The decoding module takes z as input and then outputs data of the reconstructed adjacent matrix $\hat{A}$. The decoding step can be formulated as:

$$\hat{A}=\sigma(zz^T) \tag{4}$$

where σ represents the decoding layer being activated by the sigmoid function. Moreover, $zz^T$ can be converted to $\|z\| \|z^T\| \cos\theta$. The inner product operation is beneficial to capture the spatial correlation among different contexts.

During the training phase, the joint loss function $\mathcal{L}$ is minimized, and is defined or denoted as:

$$\mathcal{L} = \sum_{i=1}^{N} \underbrace{KL[q(z \mid X, A) \| p(z)]}_{\text{KL Divergence between } q(.) \text{ and } p(.)} + \overbrace{\sum_{j=1}^{S} \|A - \hat{A}\|^2}^{\text{Loss between } A \text{ and } \hat{A}} \tag{5}$$

where N is the dimension of z, S is the total number of the nodes in A, q represents the real distribution of z, and p represents the prior distribution of z. $\mathcal{L}$ includes two parts. The first part is the Kullback-Leibler divergence between the standard prior distribution $\mathcal{N}(0, 1)$ and the distribution of z, and the second part is the squared error between A and $\hat{A}$. The training process tries to make the $\hat{A}$ close to A and get the distribution of z similar to $\mathcal{N}(0, 1)$.

Finally, global average aggregation for z is utilized to get the graph level representation, which is the latent representation of all context environments.

The graph data base contains the data that is provided to the generator module based on which it generates the land use tensor for the central area with the context data stored in the graph database. The trained encoder module converts that data to vector input data that can be understood by the generator module to create the land-use tensor data.

Land-use Configuration and Quality Measurement

The land-use configuration indicates the location of different types of POIs, which requires an appropriate format of quantification to accommodate a learning model.

To that end, the POI distribution of one area is regarded as the land-use configuration, and then, a multi-channel tensor is constructed containing data representing the land-use configuration, where each channel is the POI distribution across the geospatial area corresponding to one POI category.

Figure 8:
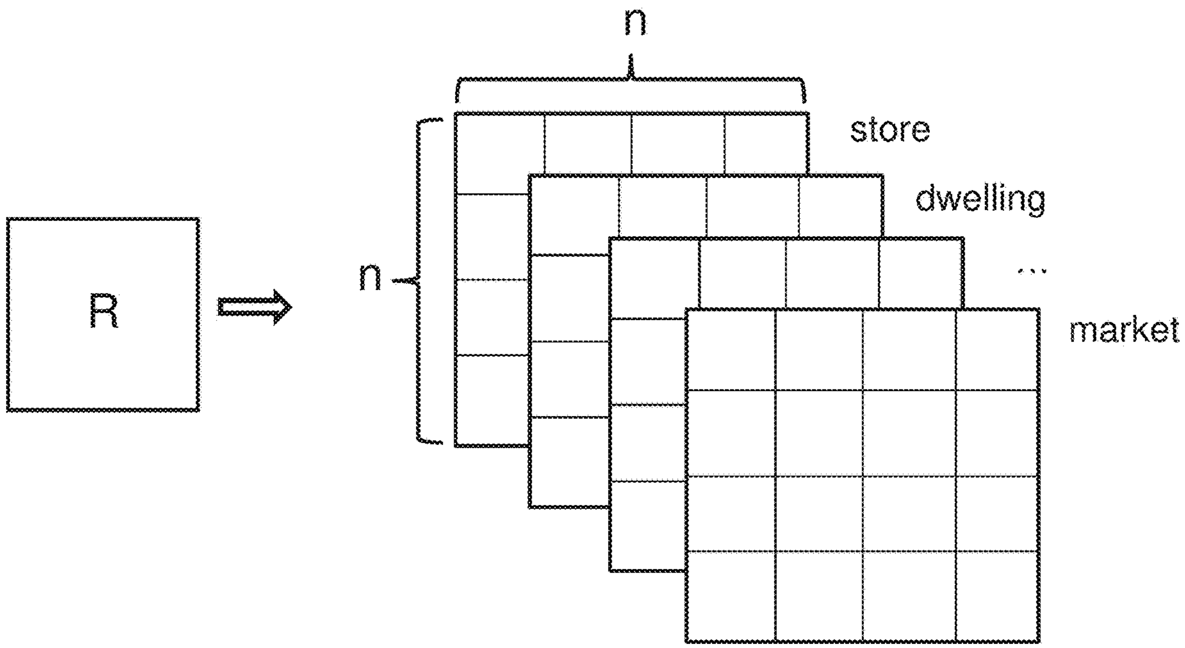
FIG. 8 is a diagram of the longitude, latitude and channel configuration tensor.

FIG. 8 illustrates construction of a land-use configuration tensor. An unplanned area is first divided into n×n squares, and then the number of occurrences in each POI category is summed up in each square, respectively. Here, one POI category constructs one channel of the land-use configuration solution, and a land-use configuration is derived as a multi-channel tensor. FIG. 8 illustrates the construction of the longitude, latitude, channel configuration tensor, where the value of each entry is the number of POIs in a specific POI category in a specific latitude range and a specific longitude range.

Next, the quality of land-use configuration of the residential community is evaluated. Because urban planning is a complex field, urban planning specialists always evaluate the quality of land-use configuration solution from multiple aspects. In the framework of the present invention, a quality hyper-parameter Q is provided for users so that they can set the value of Q to distinguish the quality of the land-use configuration solution.

For example, the POI diversity and the check-in frequency of an area may be chosen as the quality standard. First the total number of mobile check-in events of an area, denoted by freq, and the diversity of POI of an area, denoted by div, are calculated. The two indicators are then incorporated together by the calculation below to derive Q:

$$Q = \frac{2 \times freq \times div}{freq + div} [20].$$

If Q>0.5, the solution is determined to be, or is regarded as, an excellent solution, i.e., a good or very positive land-use configuration. Otherwise, it is determined to be, or justified as, a terrible solution, i.e., a bad or very negative land-use configuration.

As mentioned previously, other methods of assessing the quality assessment data value Q may be employed, such as based on historical land-use plans and expert assessments, used to train the discriminator module.

The discriminator module is initially incapable of evaluating the quality of the land-use tensor. To train the generator and discriminator, it is first provided with manually collected amounts of paired data, e.g., where each set of paired data is <surrounding context embedding, land-use configuration, quality score>. The discriminator will have evaluation capabilities after the model converges.

Generating Excellent Land-use Configuration Solution by GAN

The framework of the GAN system is suitable to generate realistic data samples via an adversarial method, and, in the present invention, the GAN framework is used to generate excellent, effective and beneficial land-use configuration solutions for an unplanned area according to the representation of the context environments.

Figure 9:
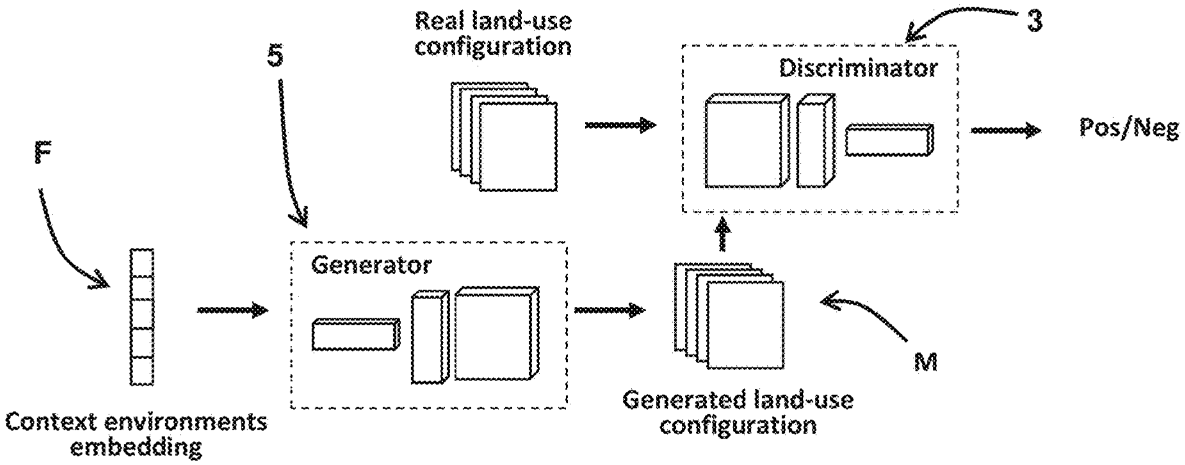
FIG. 9 is a diagram showing the overall operation of the system of the invention providing automatic land-use configuration planning.

FIG. 9 schematically illustrates the structure of the automated land-use configuration planner of the invention. In common, the real land-use configuration includes two categories: excellent and terrible. The purpose of the automated planner is to generate an excellent land-use configuration plan based on the context embedding.

Formally, the context embedding, e.g., vector F, is input into the generator 5 to generate the land-use configuration solution, i.e., land-use tensor M. In order to improve the generative ability, the discriminator 3 classifies excellent plans as positive and terrible plans as negative. Algorithm 1 below shows detail of the training phase.

Algorithm 1 is a minibatch adaptive moment estimation training of an automatic land-use configuration model. One hyperparameter f is adjusted to change the update frequencies of the weight of the discriminator. The algorithm used is:

// start training.
for number of training iterations do
| // update discriminator firstly,
| for n steps do
| | Sample minibatch of m excellent land-use configuration samples $\{E^1, E^2, \ldots, E^m\}$.
| | Sample minibatch of m context information embedding samples $\{z^1, z^2, \ldots, z^m\}$.
| | Generate land-use configuration samples by generator, $\{F^1, F^2, \ldots, F^m\}$. Here, $F^i = G(z^i)$.
| | Sample minibatch of m terrible land-use configuration samples $\{T^1, T^2, \ldots, T^m\}$.
| | Update the discriminator by ascending its gradient:
| |
| | $\nabla_{\theta_d} \frac{1}{m} \sum_{i=1}^{m} [\log(D(E^i)) + \log(D(1 - F^i)) +$
| └ $\log(D(1 - T^i))]$.
| // update generator secondly.
| Sample minibatch of m context information embedding samples $\{z^1, z^2, \ldots, z^m\}$.
| Update the generator by descending its gradient:
|
└ $\nabla_{\theta_g} \frac{1}{m} \sum_{i=1}^{m} \log(1 - D(G(z^i)))$.

In Algorithm 1, the parameters of the discriminator module 3 fix the parameters of the generator module 5. Excellent, terrible, and generated land-use configuration samples are then fed into the discriminator module. Next, the discriminator 3 outputs the classification result or assessment data value that is activated by the sigmoid function, which gives higher classification scores for excellent samples than for terrible and generated samples.

Next, the discriminator module 3 is fixed, and the parameter of the generator module 5 is updated. The contexts embedding vectors are fed into the generator 5, and generated land-use configuration solutions are output. Afterward, the generated solutions are fed into the discriminator 3 to justify their quality. The parameter of the generator module is updated to improve its generated ability. The update gradient comes from the justification result of the discriminator module 3. Finally, one automatic land-use configuration planner is obtained when the GAN model converges, meaning that the output of the model (the land-use configuration) is reasonable, and can be used in the real world to guide construction of corresponding buildings as an excellent land-use configuration for the unplanned area.

EXAMPLES

Extensive experiments and case studies were performed to answer the following questions:

(1) Does the automatic planner described here outperform the baseline methods?

(2) What is the difference between the context of excellent land-use configuration plans and terrible plans?

(3) What do generated land-use configuration plans look like?

(4) What proportion does each POI category occupy in generated plans?

(5) What are the generated situations of different categories in the generated plan?

Data Description

The following datasets of stored computer-accessible data were used:

(1) Residential Community: The residential community dataset contained data for 2,990 residential communities in Beijing, where each residential community was associated with data defining its latitude and longitude.

(2) POI: The Beijing POI dataset included 328,668 POI records from 2011, where each POI item included data defining its latitude, longitude and the category. The POI information present in the data is shown in Table 1.

TABLE 1

POI category list

| code | POI category |
|---|---|
| 0 | road |
| 1 | car service |
| 2 | car repair |
| 3 | motorbike service |
| 4 | food service |
| 5 | shopping |
| 6 | daily life service |
| 7 | recreation service |
| 8 | medical service |
| 9 | lodging |
| 10 | tourist attraction |
| 11 | real estate |
| 12 | government place |
| 13 | education |
| 14 | transportation |
| 15 | finance |
| 16 | company |
| 17 | road furniture |
| 18 | specific address |
| 19 | public service |

(3) Taxi Trajectories: The taxi trajectories dataset comprised data collected from a Beijing taxi company, where each record contained data defining a trip ID, a distance (m), travel time(s), average speed (km/h), pick-up and drop off times, and pick-up and drop-off points.

(4) Public Transportation: This dataset included data representing logs of the transactions of buses in Beijing between 2012 and 2013. After analyzing the dataset, it contained 1,734,247 bus trips for 718 bus lines. This dataset was used to derive the public transportation situation or parameters.

(5) House Price: The house price dataset included continuous five months of house-price data of each residential community in Beijing between 2011 and 2012, which was collected from the Soufang website.

(6) Check-In: This dataset was the Weibo microblog social-media check-in records in Beijing between 2011 and 2013, where each check-in data item includes data defining its longitude, latitude, check-in time and check-in place. This dataset is used to analyze the vibrancy of an area.

Evaluation Metrics

Evaluating the quality of the urban land-use configuration is a question for which there is no standard measurement, although it is nonetheless possible to observe or determine when a land-use plan is bad or terrible, and when it is good or excellent based on experience or real-world results of such land-use plans. The quality of generated planning solution in the examples was evaluated from multiple aspects to assess the effectiveness of the framework.

(1) Scoring Model. A random forest model was built based on excellent and terrible land-use configuration plans. The model was capable of giving higher scores for excellent land-use configuration plans and providing lower scores for terrible plans. When the generated land-use configuration solutions are derived, the scoring model is utilized to quantify the quality of the generated solutions.

(2) Visualization. In order to explore the generated solutions, a representative sample was selected to visualize from multiple aspects. The solutions can be observed directly in this way, which is helpful to learn the difference between the present planner and other baselines.

Baseline Methods

The performances of the system of the invention were compared with the following three baseline methods:

(1) VAE is an encoder-decoder paradigm algorithm. The encoder encodes image data into latent embedding, and the decoder decodes the embedding into the original data. In this experiment, excellent land-use configuration data was input into VAE to learn the distribution of excellent solutions by minimizing the reconstruction loss. Then, the decoder was utilized to generate the solution based on the context environment embedding when VAE converged.

(2) AVG generates the land-use configuration by calculating the mean value of all excellent land-use plans, which reflects the average level of all excellent samples, but this method cannot provide a customized solution based on different context environments.

(3) MAX generates the land-use configuration solutions by applying max operation on all excellent land-use plans. The result of this method reflects the most dominated POI categories in each geographical block. As with AVG, MAX also cannot generate a customized solution based on different context environments.

All experiments were conducted on an x64 computer system with Intel i9-9920X 3.50 GHz CPU processor with 128 GB RAM computer-accessible memory running Ubuntu 18.04 Linux operating system software.

Overall Performance

Figure 10:
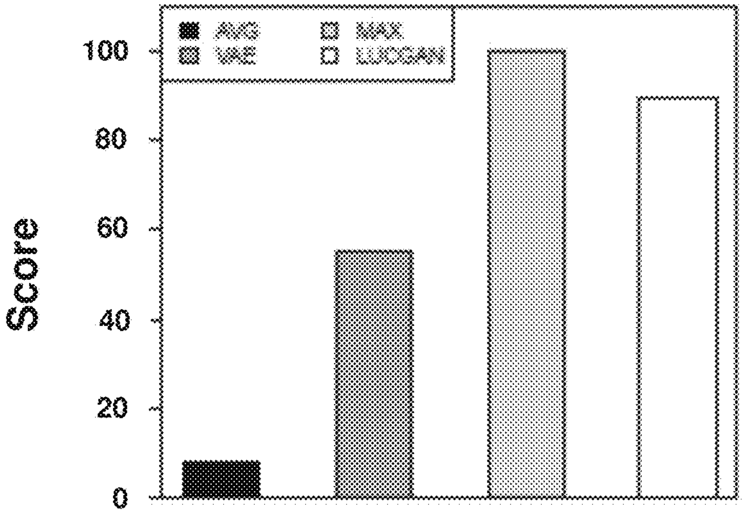
FIG. 10 is a chart showing comparative quality scores for different generating methods.

FIG. 10 shows the quality score produced by the scoring model for the different generated methods. An interesting phenomenon is that the MAX method ranks first compared with other methods. A possible explanation is the scoring model only captures the distribution of original excellent plans. The MAX method incorporates all excellent plans by max operation, so the generated solution reflects the dominated POI categories of each geographical block, which is also inherent in the original data distribution. Therefore, the scoring model gives the highest score for the MAX method. Although the MAX method ranks first, it does not indicate the MAX method is better than the LUCGAN system described here. That is because the MAX method only produces one kind of planning solution no matter what the context environment is. However, the LUCGAN system can customize the solutions based on different context environment embedding. In addition, the score of LUCGAN system is also high, which indicates the LUCGAN system captures the intrinsic rule of excellent plan distribution. So the LUCGAN system is an effective and flexible method for generating land-use configuration.

Study of the Geographical Distribution Generated by Different Approaches

In order to observe the generated land-use configuration system described herein clearly, a representative land-use configuration was selected to visualize. Owing to the fact that the generated land-use tensor has multiple channels and that each channel has many blocks, these channels of the land-use tensor were merged into one by setting the dominated POI category as the final result for each geographical block. The merged solution reflects POI distribution in geographical spatial space.

Figure 11:
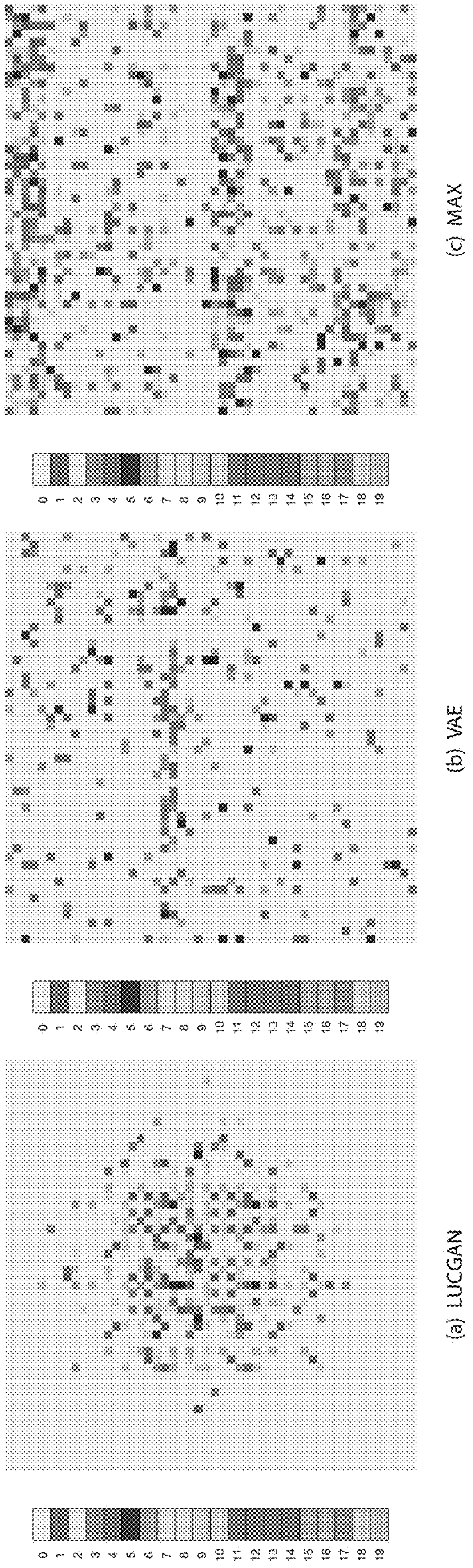
FIG. 11 is a diagram showing comparisons of different generated land-use configurations using the method of the invention as well as other methods.

FIG. 11 shows a visualization of results of land-use plans by the system of the invention and the baseline methods. The blocks represent POI categories. As may be seen, the land-use plan generated by the LUCGAN system is regular and organized, and different POI categories intersect with each other. In contrast, the distribution of generated solutions by VAE and MAX are so chaotic that there no clear promising patterns. This indicates the superior effectiveness of the LUCGAN system compared with other baseline methods.

Study of the Generation for Each POI Category

Figure 12:
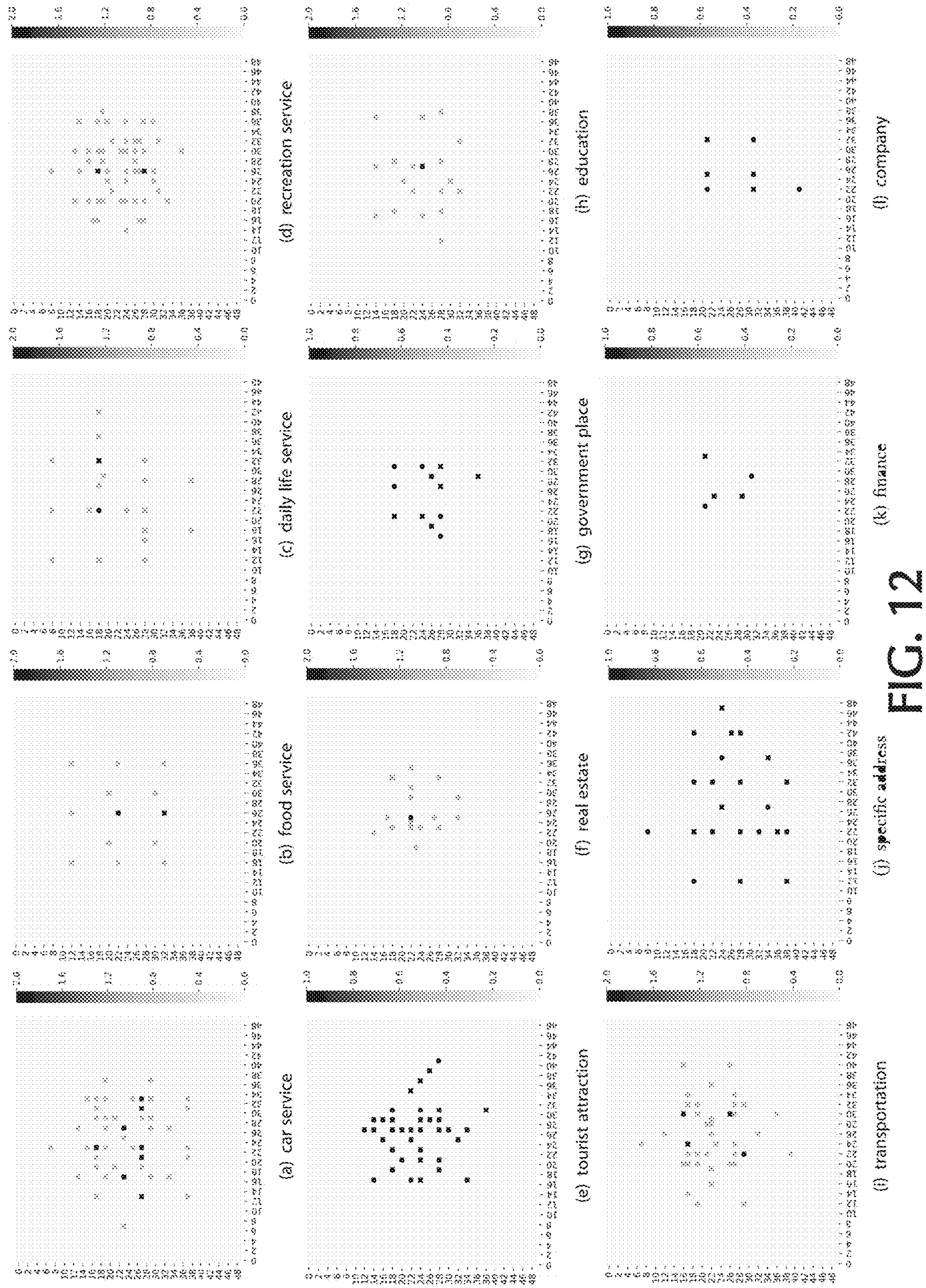
FIG. 12 shows the distribution of some of the POIs in a land-use plan generated by a system according to the invention.

Referring to FIG. 12, the generated configuration for each POI category, the POI distribution may be visualized for each POI category.

Twelve POIs of an exemplary land-use tensor created by the system of the invention were randomly selected for visualization. In FIG. 12, the darker color block represents the larger POI number in the block. An interesting observation is that the POI distribution of different categories shows their unique patterns. For example, transportation POIs, e.g., a bus station, a subway station, etc., are more concentrated, while food service related POIs are more dispersed across the area. The distribution of car service spots is very similar to the recreation services, and the possible reason is that recreation service spots may occupy many parking lots which potentially attract car services.

To summarize, through the above experiments, it is clear that the LUCGAN system is able to generate good quality land-use plans based on the context environment embedding effectively and flexibly.

The POI Proportion Generated by Different Approaches

After obtaining the generated solutions from different generating methods, the number of each POI category of different solutions was counted respectively. Then the proportion of each POI category of the solutions was visualized.

Figure 13:
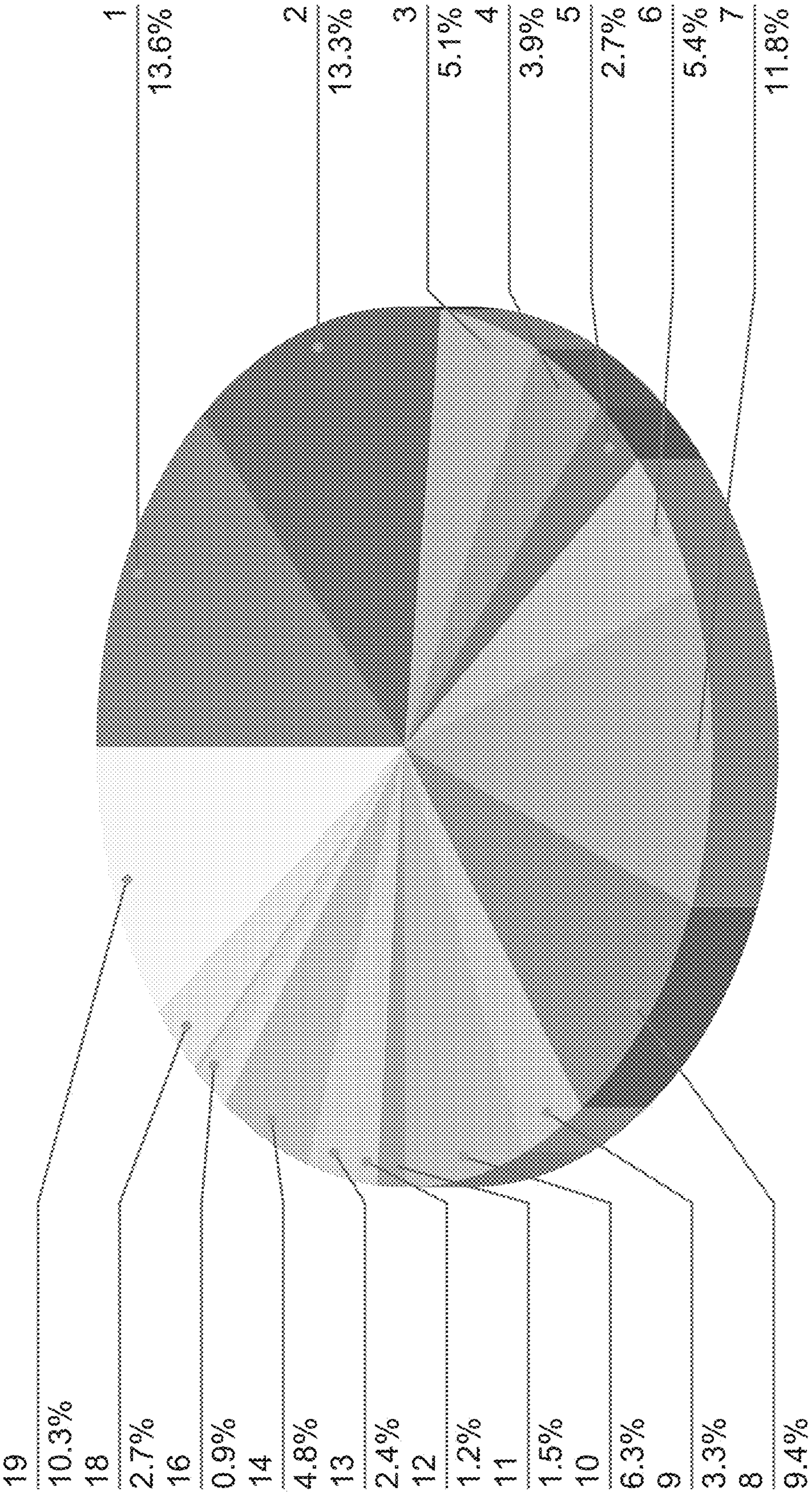
FIG. 13 is a pie chart showing the proportions of each of the POIs in a land-use configuration plan generated according to the invention.
Figure 14:
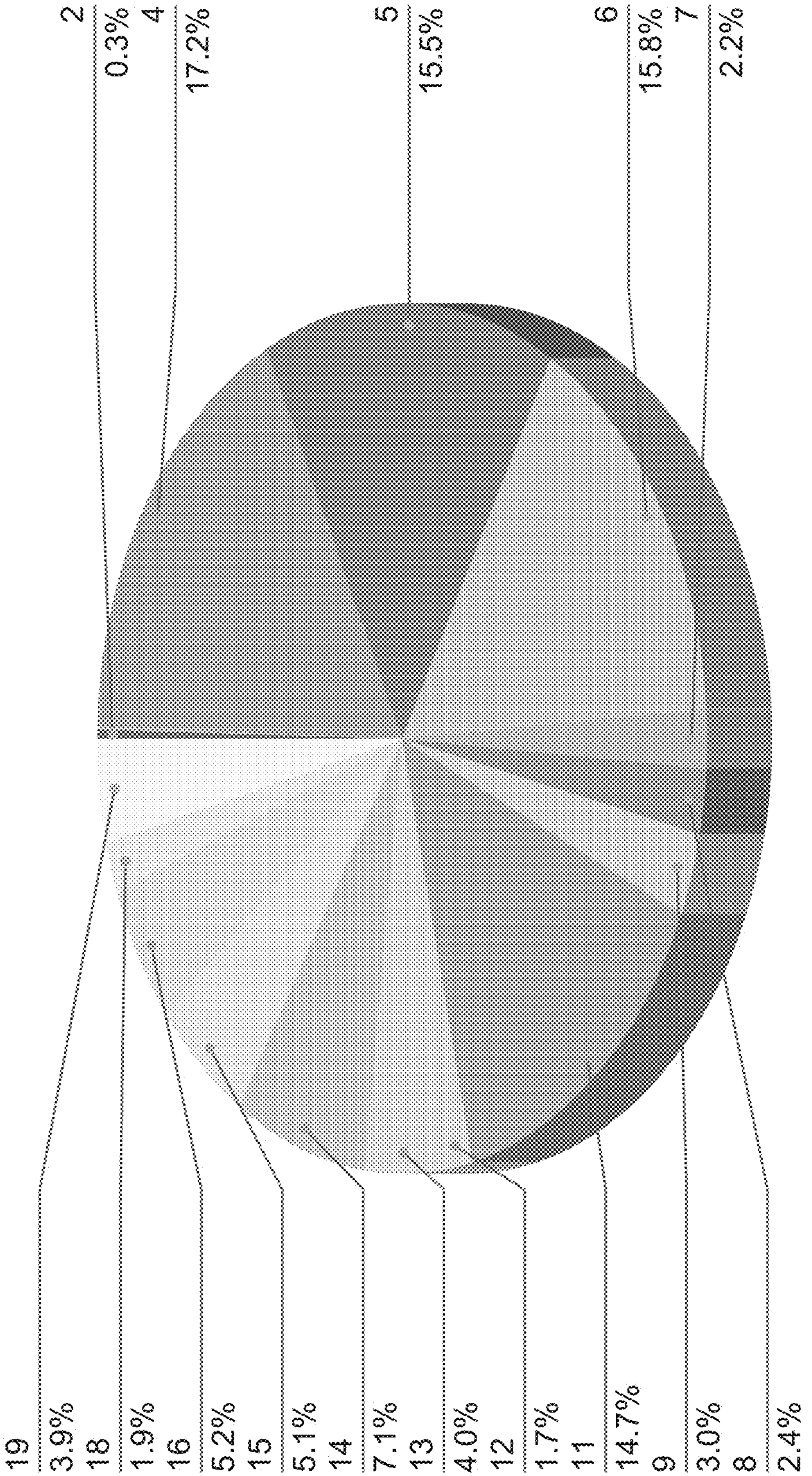
FIG. 14 is a pie chart showing the proportions of each of the POIs in a land-use configuration plan generated by the VAE method.
Figure 15:
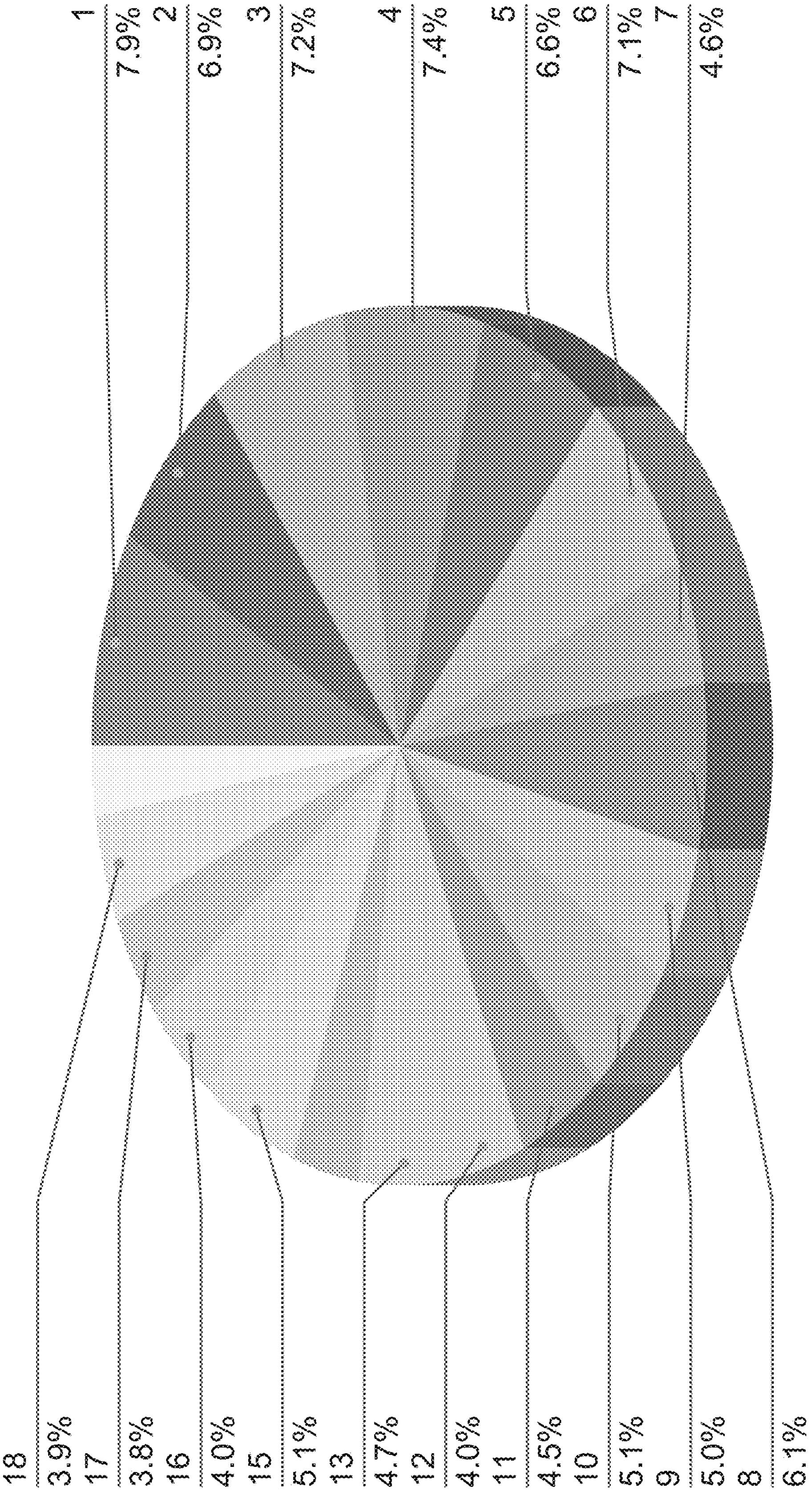
FIG. 15 is a pie chart showing the proportions of each of the POIs in a land-use configuration plan generated by the MAX method.

Referring to FIGS. 13, 14 and 15, the proportional presence of POI by different generated methods, i.e., the system of the invention (LUCGAN), the VAE method, and the MAX method, are compared.

In FIG. 13, it may be observed that the LUCGAN generated result has all POI categories, and POI category 4 (food service), POI category 5 (shopping), POI category 6 (daily life service) and POI category 7 (recreation service) occupy a big proportion of the POI categories. In addition, these four POI types are all related to the economic activities closely. The LUCGAN generated solutions therefore satisfy the design scheme.

FIG. 14 shows the POI proportion relation in a VAE generated result. In this plan, POI category 1 (car service) and POI category 17 (road furniture) were missing, so the POI diversity of VAE was not complete.

FIG. 15 shows the POI proportion relation in a MAX generated result. Each POI category occupies a balanced proportion, which indicates that the MAX method is stubborn or inflexible. This is because the MAX method cannot generate land-use configurations based on people's requirements. The flexibility of the MAX method is consequently worse than that of VAE and the LUCGAN system.

The terms used herein should be read as terms of description rather than of limitation. While embodiments of the invention have here been described, persons skilled in this art will appreciate changes and modifications that may be made to those embodiments without departing from the spirit of the invention, the scope of which is set out in the claims.

What is claimed is:

1. A computerized system for generating a land-use plan, said system comprising:

a computer having an input receiving data and an output transmitting data to a display viewable by a user;

the computer having data storage with data therein that provides the computer with a generator module;

the generator module being a trainable AI module that has been trained with a computer-supported discriminator module that functions as a generative adversarial network with the generator module so that the generator module generates land-use plan tensor data for good land use plans by repeated training cycles of an adversarial training process in each of which cycles:

the generator module receives input data having context data for an associated geographical area;

the generator module generates land-use data from said input data wherein said land-use data defines a land use plan for the associated geographical area; and the discriminator module receives the land-use data from the generator module and derives therefrom quality assessment data corresponding to an assessment of quality of the land use plan of the land use data; and the assessment data is returned to the generator module;

wherein the training cycles are repeated for each input data until the generator module learns to derive said land-use data that defines land-use plans for which the discriminator module derives quality assessment data that reaches a predetermined threshold value; and wherein, responsive to being input context data for a new geographical region, said generator module generates a land-use tensor defining a land use plan for the new geographical region; and the computer outputs land-use plan output data defining the land-use plan for the new geographical region;

wherein the discriminator module has been trained by applying thereto training data comprising sets of training data each comprising input training data and associated output training data, wherein the input training data comprises a plurality of land-use tensor data sets each defining a respective land-use plan for a respective geographical territory, and wherein each of the associated output training data includes assessment data defining a level of quality of the land-use plan of the input data, such that the discriminator module has learned to generate assessment data indicative of quality of a land-use plan defined by a land-use tensor data input supplied to said discriminator module.

2. The computerized system according to claim 1, wherein the land-use plan tensor is organized as a tensor with elements organized in three dimensions, wherein two of said dimensions are geographical dimensions of the geographical area, and the third dimension is different channels each containing data defining a respective type of land use over the geographical area.

3. The computerized system according to claim 1, wherein the types of land use include transportation, roads, residences, and stores.

4. The computerized system according to claim 1, wherein the land-use tensor for the new geographical region is transmitted to the discriminator module, and is output only if the assessment data for said land use plan has a value that reaches or exceeds a set value for minimum quality of the land-use plans of the generator module, and where the generator module is caused to generate another land use tensor responsive the assessment data indicating that the assessment data did not reach the set value for minimum quality for the land-use plan.

5. The computerized system according to claim 1, wherein input data and the input context data are each vectors containing context data regarding context areas around the associated geographical area or region.

6. The computerized system according to claim 5, wherein the context data includes data derived from at least one of housing prices, point of interest data of the context areas, and private or public transportation.

7. The computerized system according to claim 6, wherein the graph database context data is embedded in the vector as a latent vector.

8. The computerized system according to claim 5, wherein said vectors include data from context areas, and said data is organized in a graph database wherein each of the context areas is a respective node.

9. The computerized system according to claim 1, wherein the assessment data contains a Q-value numerically indicative of quality of the respective land-use tensor received by the discriminator module and context data for adjacent areas of the associated land-use tensor.

10. The computerized system according to claim 1, wherein some of the land-use plans defined by the input training data are of bad or terrible quality, and the assessment data for said bad or terrible land-use plans includes a respective Q-value corresponding to low quality, and some of the land-use plans defined by the input data are of good or excellent quality, and the assessment data for said good or excellent land-use plans includes a respective Q-value corresponding to high quality of said land-use plans.

11. The computerized system according to claim 1, wherein the generator module has been trained to output a set of land-use data that corresponds to a land-use tensor defining a land-use plan for a geographical area responsive to the generator module receiving vector data that corresponds to a vector of context data for the geographical area by a training process that includes:

providing to the generator module a plurality of sets of training vector data each comprising respective context data for a respective geographical territory; and for each of the sets of the training vector data, repeatedly generating with the generator module sets of land-use data that each corresponds to a respective land-use tensor defining a respective land-use plan for said geographical region, and transmitting each of said sets of land-use data to the discriminator module so as to derive respective assessment data therefrom, and returning the respective assessment data so that the generator module learns therefrom until the discriminator module returns assessment data indicating that a most recent set of the land-use data defines a land-use plan of a quality that reaches a predetermined value.

* * * * *